United States Patent [19]
Kimura

[11] Patent Number: 5,801,475
[45] Date of Patent: Sep. 1, 1998

[54] PIEZO-ELECTRICITY GENERATION DEVICE

[75] Inventor: Mitsuteru Kimura, Miyagi, Japan

[73] Assignees: Mitsuteru Kimura, Miyagi; Ricoh Seiki Company, Ltd., Tokyo, both of Japan

[21] Appl. No.: 812,070

[22] Filed: Mar. 6, 1997

Related U.S. Application Data

[63] Continuation of Ser. No. 573,913, Dec. 18, 1995, abandoned, which is a continuation-in-part of Ser. No. 207,122, Mar. 8, 1994, abandoned.

[30] Foreign Application Priority Data

Sep. 30, 1993 [JP] Japan ................... 5-268317

[51] Int. Cl.[6] ........................................ H01L 41/08
[52] U.S. Cl. .................. 310/319; 310/329; 310/330; 310/339
[58] Field of Search .................. 310/329, 338, 310/339, 324, 319, 800, 331–332

[56] References Cited

U.S. PATENT DOCUMENTS

| | | | |
|---|---|---|---|
| H372 | 11/1987 | Campbell | 310/339 |
| 2,928,052 | 3/1960 | Wood | 310/319 |
| 3,359,904 | 12/1967 | Nerheim | 310/329 X |
| 3,366,808 | 1/1968 | Steward | 310/330 X |
| 3,389,275 | 6/1968 | Brothers | 310/329 X |
| 3,392,979 | 7/1968 | Wilska | 310/319 X |
| 3,456,134 | 7/1969 | Ku | 310/330 |
| 3,539,841 | 11/1970 | Riff | 310/319 X |
| 3,548,314 | 12/1970 | Mitchell | 310/319 X |
| 3,624,264 | 11/1971 | Lazarus | 310/329 X |
| 3,701,903 | 10/1972 | Merhar | 310/329 X |
| 3,749,947 | 7/1973 | Kawada et al. | 310/319 X |
| 4,048,526 | 9/1977 | Taylor | 310/329 |
| 4,327,359 | 4/1982 | Kurtz | 310/329 X |
| 4,378,510 | 3/1983 | Bennett | 310/329 |
| 4,658,650 | 4/1987 | Yorinaga et al. | 310/329 X |
| 4,712,098 | 12/1987 | Laing | 310/319 X |
| 4,804,875 | 2/1989 | Albert | 310/329 X |
| 4,839,872 | 6/1989 | Gragnolati et al. | 310/800 X |
| 4,924,131 | 5/1990 | Nakayama et al. | 310/329 |
| 5,065,067 | 11/1991 | Todd et al. | 310/339 |

*Primary Examiner*—Mark O. Budd
*Attorney, Agent, or Firm*—McDermott, Will & Emery

[57] ABSTRACT

A piezo-electricity generation device without an external power supply unit includes a rectifying means which rectifies an AC voltage generated by the vibration of at least one piezo-electric plate. An accumulating means accumulates an electric charge outputted through the rectifying means. A voltage setting means provides a prespecified voltage. A transmission means transmits substantially all of the electric charge accumulated in the accumulating means to a signal output means when the output voltage of the accumulating means exceeds the prespecified voltage set by the voltage setting means. A timing setting means may also or alternatively be provided for setting a prespecified timing such that the transmission means transmits substantially all of the electric charge stored in the accumulating means at the prespecified timing set by said timing setting means.

27 Claims, 5 Drawing Sheets

PIEZO-ELECTRICITY GENERATION DEVICE

This application is a continuation of application Ser. No. 08/573,913 filed Dec. 18, 1995, now abandoned, which is a continuation-in-part of application Ser. No. 08/207,122 filed Mar. 8, 1994, now abandoned.

FIELD OF THE INVENTION

This invention relates to a electricity generation device in which a piezo-electric plate is expanded and contracted, and AC voltage generated in electrodes provided in this piezo-electric plate is rectified and stored in a capacitor, and the piezo-electricity generation device according to this invention works without any power supply unit such as a battery and making use of vibration, so that an electric power can be generated anytime according to the necessity.

This invention can be applied to an alarm device which transmits an electric wave, making use of this vibration energy as a power, for alarming in an earthquake, and also this invention makes it possible to manufacture a very small electricity generation device, which can be used in such an application as a device for reporting a position of a moving object such as a domestic animal or a bird.

BACKGROUND OF THE INVENTION

There has been developed a device which receives an electric wave transmitted from outside, converts the electric wave to electric energy, and makes use of this electric energy as a power for a portable electric device in place of battery power. For instance, a signal generator incorporating the generation device as described above is attached to each of cattle being grazed in a meadow, an electric wave is sent to the generator, when the cattle passes through a gate, so that the signal generator can work to automatically generate a signal indicating an ID number of the cattle.

However, in case of the generation device making use of an electric wave as described above, when the generation device is located far from an electric wave source, an adequate quantity of energy can not be obtained, and for this reason the generation device can be used within a limited range from an electric wave source.

SUMMARY OF THE INVENTION

It is an object of the present invention to provide a compact electricity generation device having no power supply unit which converts vibration energy generated, for instance, in forced vibration to electric energy and stores the electric energy in a capacitor so that an electric power can be taken out therefrom. Furthermore it is another object of the present invention to provide an electricity generation device incorporating therein an electronic circuit which can transmit a signal such as an electric wave, sound, or light according to the necessity.

In a piezo-electricity generation device according to the present invention, a pair of electrodes are provided on a piezo-electric plate, this piezo-electric plate is vibrated in the state where the plate is supported on one side, on both sides, or on the peripheral section thereof so that the piezo-electric plate is expanded or contracted during vibration, AC voltage generated in the pair of electrodes provided in the piezo-electric plate is rectified and stored in a capacitor, and the electric power is taken out from this capacitor according to the necessity.

It is preferable to attach a weight to a section effective for maximizing the vibration amplitude so that the piezo-electric plate can easily vibrate and also can expand and contract.

Also a combination of vibration plates each generating a piezo-electricity may be used so that vibration can be divided two-dimensionally or three-dimensionally.

Furthermore it is allowable to incorporate therein an electronic circuit which generates a signal such as an electric wave, sound, or light, making use of an electric power stored in the capacitor when a voltage across the capacitor exceeds a pre-set value.

Other objects and features of this invention will become understood from the following description with reference to the accompanying drawings.

DESCRIPTION OF THE PREFERRED EMBODIMENTS

Figure 1:
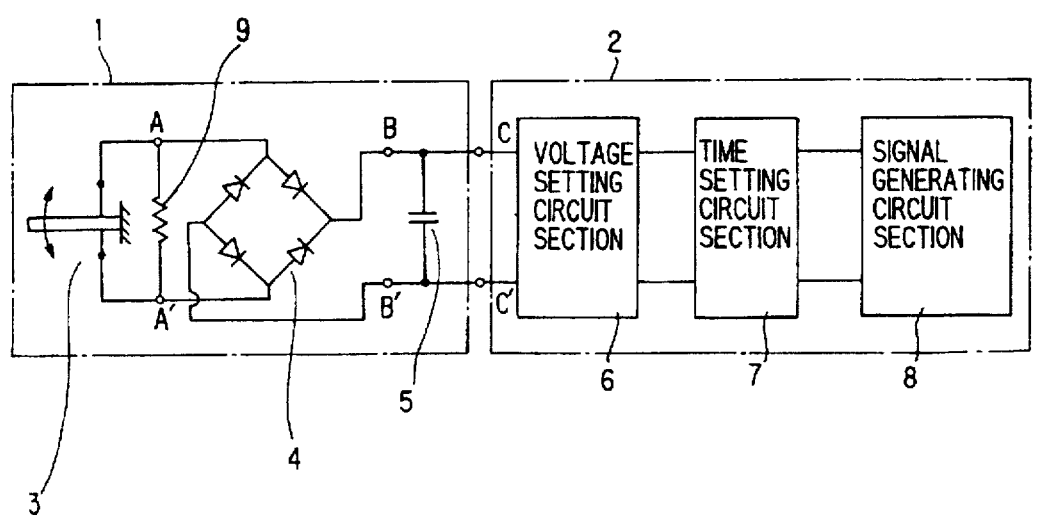
FIG. 1 is a block diagram illustrating a piezo-electricity generation device.

Description is made hereinafter for preferred embodiments of the present invention with reference to the related drawings. As shown in the block diagram in FIG. 1, this piezo-electricity generation device comprises a basic section 1 and an attached circuit 2, said basic section comprising a piezo-electricity generation section 3, a rectifier 4, a capacitor 5 and a resistor 9, and said attached circuit 2 comprising a voltage setting circuit section 6, a time setting circuit section 7, and a signal generating section 8 according to the necessity.

Figure 2:
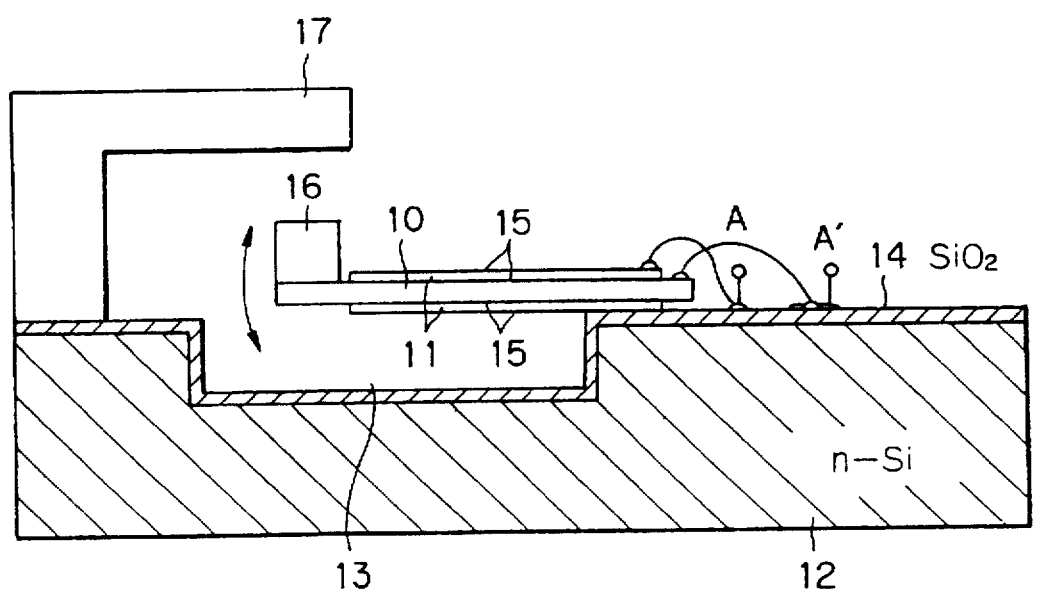
FIG. 2 is a view illustrating a cantilever form of piezo-electricity generation section.

The piezo-electricity generation section 3 is a section where a piezo-electric plate vibrates to generate electricity, and an example thereof in a cantilever form is shown in FIG. 2. To each of both surfaces of a slender phosphorous bronze plate 10 (having, for instance, thickness of 0.5 mm, length of 15 mm, and width of 2 mm) is attached a piezo-electric ceramic plate 11 (having, for instance, thickness of 0.5 mm, length of 10 mm, and width of 2 mm), and the hybrid is attached to an n-Si substrate 12. A groove 13 is formed in the n-Si substrate 12, which is a silicon single crystal substrate, and an $SiO_2$ thin film 14 is formed on the surface for electric insulation by means of thermal oxidization.

A pair of electrodes 15 each comprising a metallic thin film are formed on both surfaces of each piezo-electric ceramic plate 11, and the electrodes are connected to output terminals A, A' on the substrate. When forced vibration is effected, the phosphorous bronze plate 10 vibrates up and down, two sheets of piezo-electric ceramic plate 11 expand and contract alternately, and AC voltage is generated in each ceramic plate 11 respectively. Connection is established that the AC voltages are superimposed and provided at the terminals A, A'.

It is preferable to adhere a weight 16 to a vibrating edge of a cantilever of the piezo-electric plate. Also to prevent the vibration plate from being broken because the vibration amplitude is too large, it is preferable to adjust depth of the groove to an appropriate level and also to provide a stopper for limiting the vibration amplitude.

The piezo-electricity generation section 3 may be formed monolithically, although the configuration is now shown herein. An acceleration sensor using a silicon substrate and having a silicon weight at a tip thereof has been known, and like in this configuration, the technology according to the present invention can be combined with an isotropic etching technology for a silicon substrate with a silicon weight attached to a tip of a cantilever comprising a silicon nitrate thin film and also with, for instance, a ZnO thin film as a piezo-electric material formed on the silicon nitrate thin film cantilever by means of sputtering or zol-gel method so that a piezo-electric effect in the lateral direction can be obtained by poling. With this configuration, it is possible to form a monolithic piezo-electricity generation device not requiring the technology for adhesion, which in turn makes it possible to reduce a size of a piezo-electricity generation device and to produce the piezo-electricity generation device in mass. By forming a piezoelectric thin film by means of the zol-gel method or sputtering, it is possible to form a very small piezo-electricity generation device with high precision and to form the piezo-electric thin film at a position proximate, i.e. very close, to an integrated circuit. The highly voltage-resistent rigid oxide film, $SiO_2$ film on the single crystal substrate facilitates attachment of the piezoelectric plate to the substrate.

Figure 5:
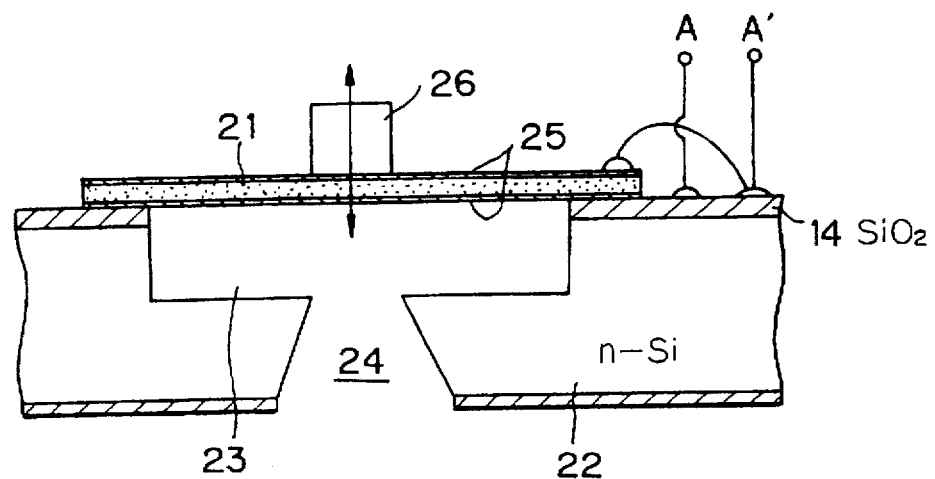
FIG. 5 is a view illustrating a diaphragm type of piezo-electricity generation section.

An example of a diaphragm type of piezoelectricity generation section is shown in FIG. 5. For instance, a circular groove 23 is formed in an n-Si substrate 22, which is a silicon single crystal substrate, and a polyvinyliden fluoride (PVDF) plate or film 21 with a pair of electrodes 25 on both surfaces thereof respectively is spanned over the groove to cover it, and a weight 26 is provided at the center, so that the PVDF film 21 expands and contracts due to vibration and a piezo-electric electromotive force will be generated between a pair of electrodes 25. It is preferable to provide a hole 24 reaching the circular groove 23 in the rear surface of the n-Si substrate 22.

Any specific example of a double-supported type of piezo-electricity generation section, however the cross section thereof is almost the same as that in FIG. 5.

The rectifier 4 shown in FIG. 1 may be either a full-wave rectification circuit or a half-wave rectification circuit based on a combination of diodes, or a voltage double rectifier. As a diode to be used in this rectifier 4, either a p-n junction diode or a Schottky diode can be used. The Schottky diode has a threshold voltage which is smaller than that of a p-n diode. For example, if the diode is formed on a silicon substrate, a p-n diode may have a threshold voltage of approximately 0.065 volts while the threshold voltage in a Schottky diode is approximately 0.30 volts. Accordingly, the use of a Schottky diode instead of a p-n diode will reduce the power consumption required for recitification and will effectively increase the electrical charge available for accumulation by the capacitor. When an electro motive force in the piezo-electricity generation section 3 is small, a Schottky diode having a low rising voltage is more preferable. It is preferable to set a resistor 9 having a resistance value smaller than a reverse biased value of diodes $D_1$, $D_2$ at the terminals A, A' respectively when a resistance value of the piezo-element is larger than reverse biased resistance of diodes $D_1$, $D_2$.

Figure 3:
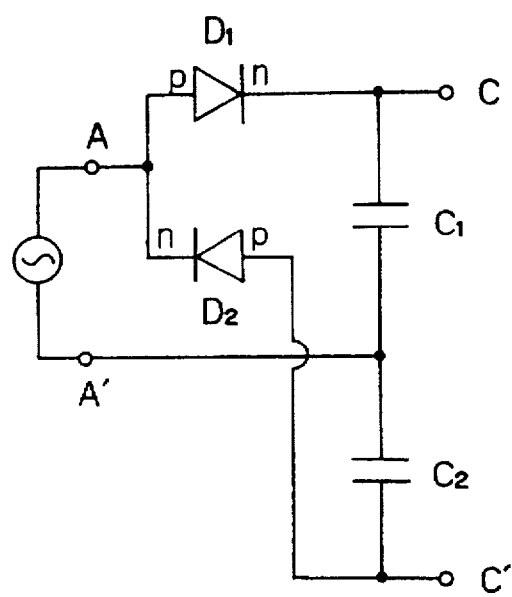
FIG. 3 is a circuit diagram for a voltage double rectification type of rectifier.
Figure 4:
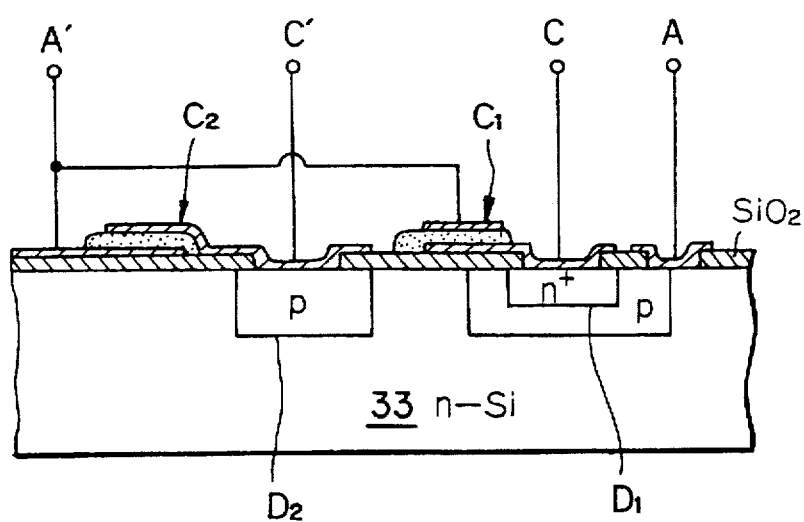
FIG. 4 is a cross sectional view of a monolithic substrate of the circuit shown in FIG. 3.

FIG. 3 is a circuit diagram of a rectification section when an AC piezo-electricity electromotive force is subjected to voltage double, i.e. full wave, rectification, and FIG. 4 is a diagram corresponding to the circuit shown in FIG. 3. A rectification section with p-n junction diode $D_1$ and $D_2$ on the n-Si substrate 33, which is a silicon single crystal substrate, and MOS capacitors $C_1$, $C_2$ and so forth are monolithically formed. Furthermore, as described above, by arranging a piezo-electricity generation section in a monolithic on an n-Si substrate, i.e. the silicon single crystal substrate, it is possible to form a basic configuration of a very compact piezo-electricity generation section.

When the piezo-electricity generation device according to the present invention is used in an earthquake alarming device, when an earthquake having some degree of magnitude occurs, an electromotive force is generated in the piezo-electricity generation section and the electromotive force is sustained for a certain period of time, so that the voltage V across the capacitor 5 gradually goes up. The voltage setting circuit 6 shown in FIG. 1 causes the signal generation circuit 8 to work when this voltage V exceeds a prespecified value and accordingly substantially all, i.e. the major portion, of the charge stored in capacitor 5 is transmitted to the signal generation circuit 8.

In order to transmit substantially all of the charge stored in capacitor 5 to the signal generation circuit 8, a circuit having a negative resistance element, such as a thyrister, is utilized. The capacitor 5 or other accumulating device provides a portion of the accumulated voltage to a high impediance circuit which includes another capacitor and a resistor. The voltage is loaded to the gate of the thyrister. Accordingly, when the thyrister is turned on most of the electrically charge accumulated in the capicator 5 flows to the signal generating circuit section 8, via the time-setting circuit section 7 if included in the system.

Then the signal generation circuit section 8 generates an electric wave to alert that an earthquake has occurred. It is possible to convert the emitted electric wave to a signal indicating magnitude of the earthquake or from which piezo-electricity generation device the signal is being transmitted. Also it is allowable to generate sound or light instead of an electric wave.

The time setting circuit section 7 is arranged to cyclically take out substantially electric charge stored in the capacitor 5 so that a large quantity of electric power is consumed at once and an electric wave is transmitted to a distant site. The voltage setting, signal generation and time setting circuits can be formed as an IC on an n-type of silicon single crystal substrate, so that the circuits can be integrated with the basic section described above, and shown in FIG. 4, into a monolithic form.

Figure 6:
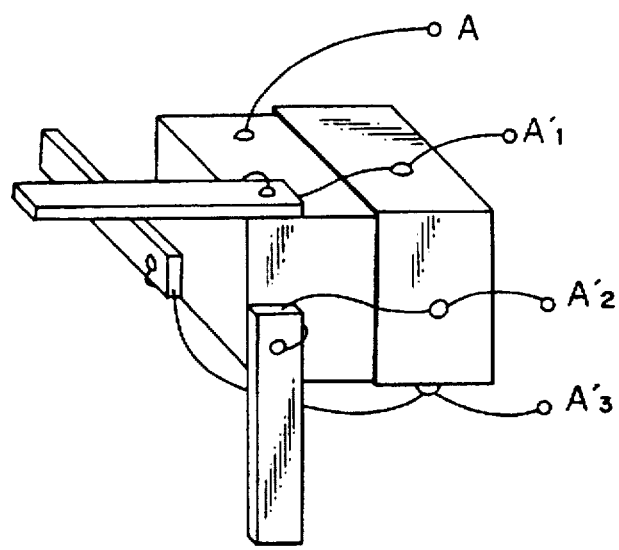
FIG. 6 is a perspective view of a piezoelectricity generation section based three-dimensional configuration.

FIG. 6 shows an arrangement wherein three units of the bimorph vibration type of piezo-electricity generation section shown in FIG. 2 are combined so that vibration is divided to three components crossing each other at right angles. A weight is not shown in the arrangement in FIG. 6, but a weight may be used. Different from this cantilever type as shown in this figure, three units of diaphragm type of double-supported type of piezo-electricity generation section may be combined. The respective voltages generated by the plates are combined to form a synthesized electrical charge which is accumulated in capacitor 5.

Figure 7A:
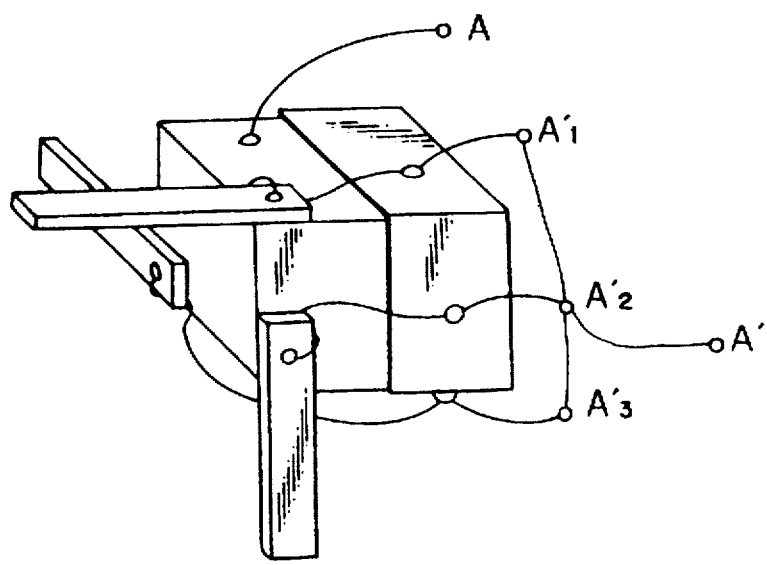
FIG. 7A is a perspective view of a piezo-electricity generation section with the electric charge synthesized before rectification.

FIG. 7A depicts an arrangement wherein three bimorph vibration type units of the piezo-electricity generation section shown in FIG. 2 are combined so that vibration is divided into three components each of which is at right angles with respect to the others. As discussed with reference to the FIG. 6 arrangement, a weight may be added to each of the vibrating elements or the arrangement could utilize three diaphragm type piezo-electricity generation sections in lieu of the cantilever type structures shown. As depicted in FIG. 7A, vibration is converted to electric energy irrespective of the direction of the force which drives the vibration. The outputs of the respective piezo-electric plates, i.e. $A'_1$, $A'_2$ and $A'_3$ are combined to form a synthesized electric change for transmission to the capacitor 5 for storage. As shown in FIG. 7A, the synthesization of the electric charge is performed prior to rectification. As a result, the voltage generated by the vibration of the respective piezo-electric plates may be offset due to differences in the phase or frequency of vibration of the respective piezo-electric plates. It will be understood that the voltage offset can be managed in any number of ways during synthesization. However, the offset will impact the rectification and accumulation of the generated charge. Since the synthesization of the electrical charge is executed before rectification, only a single rectification circuit is required and the number of diodes can be minimized.

Figure 7B:
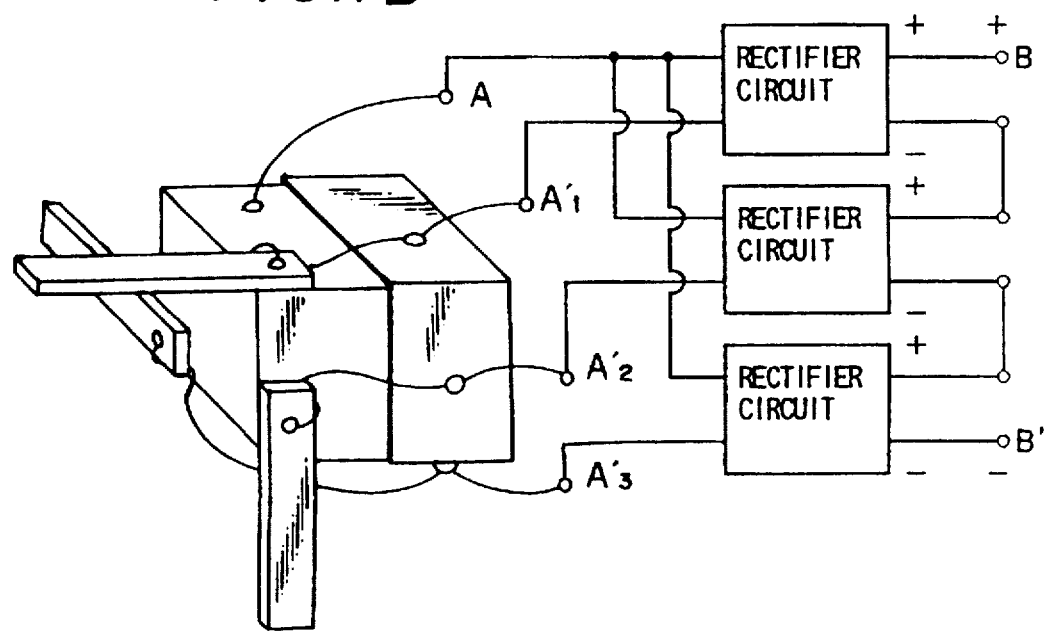
FIG. 7B is a perspective view of a piezo-electricity generation section with the electric charge synthesized after rectification.

FIG. 7B shows an arrangement having a piezo-electricity generation section identical to that shown in FIG. 7A. However, in FIG. 7B, synthesization of the generated electric charge is executed after rectification. More particularly, the outputs from the respective piezo-electric plates, i.e. $A'_1$, $A'_2$ and $A'_3$ are first respectively rectified in rectifier circuits $4'_1$, $4'_2$ and $4'_3$ and are then synthesized before further transmission to the capacitor 5 for storage. In the FIG. 7B arrangement, the voltages generated by the respective piezo-electric plates are more easily synthesized than the unrectified voltages of FIG. 7A. In this case, the electric charge can be stored in a capacitor only when a DC current at each terminal after rectification is larger than a voltage in the capacitor to be charged. However, a larger number of rectifier circuits and hence a greater number of diodes are required in the FIG. 7B arrangement as compared to the arrangement depicted in FIG. 7A.

In the piezo-electricity generation device according to the invention, a piezo-electric plate is expanded and contracted by vibration to generate a voltage between electrodes provided on the piezo-electric plate, and the electric power is stored in a capacitor, so that this piezo-electricity generation device can work without any power supply unit such as a battery, making use of vibration, and can provide an electric power according to the necessity, and for this reason this piezo-electricity generation device can be used in such applications as an earthquake alarming device which generates an electric wave making use of the vibration energy, when an earthquake occurs, for alarming.

Furthermore, if semiconductor made of such a material as silicon is used as the substrate, the semiconductor IC technology can be used, so that the piezo-electricity generation device can be integrated with other electronic circuits into a monolithic form, and for this reason a highly reliable and cheap device, which can be produced in mass, can be obtained.

In the piezo-electricity generation device according to the invention, a weight is attached to a vibrating section of the piezo-electric plate, and in this arrangement, the piezo-electric plate can easily vibrate and accordingly a degree of expansion and contraction becomes larger, so that a large electric power can be obtained.

In the piezo-electricity generation device according to the invention, three-dimensional vibration can be divided into a vibration component in each of three orthogonal directions, which is useful in knowing a direction of vibration.

The piezo-electricity generation device according to the invention incorporates an additional circuit which transmits a signal such as an electric wave, sound, or light, when a voltage exceeds a prespecified value, making use of an electric power stored in the capacitor, so that this piezo-electricity generation device is useful when used in an earthquake alarming device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A signal generator, including a piezo-electricity generation device having a rectifying means for rectifying an AC voltage generated by free-vibration of at least one piezo-electric plate and an accumulating means for accumulating therein electric charge outputted through said rectifying means, comprising:

a voltage setting means, powered only by the piezo-electricity generation device, for setting a prespecified voltage and generating a signal when the electric charge accumulated in the accumulating means exceeds the prespecified voltage; and a signal output means, powered only by the piezo-electricity generation device, for receiving substantially all of the electric charge accumulated in said accumulating means when an output voltage of said accumulating means exceeds the prespecified voltage set by said voltage setting means and applying only the received charge to generate a signal.

2. A piezo-electricity generation device according to claim 1, wherein said signal is in the form of an electric wave, a sound or a light.

3. A piezo-electricity generation device according to claim 1, wherein said rectifying means is a Schottky diode.

4. A piezo-electricity generation device according to claim 1, wherein said at least one piezo-electric plate is a combination of piezo-electric plates and three-dimensional vibration can be decomposed into respective components and each of said components vibrates a different one of said piezo-electric plates.

5. A piezo-electricity generation device according to claim 1, wherein said at least one piezo-electric plate includes multiple piezo-electric plates arranged with respect to each other so that voltages from the piezo-electric plates can be combined and a synthesized electric charge can thereby be accumulated in said accumulating means irrespective of a direction of vibration within a three-dimensional coordinate system.

6. A piezo-electric generation device according to claim 1, wherein a weight is added to a vibrating section of said at least one piezo electric plate.

7. A piezo-electricity generation device according to claim 1, wherein said at least one piezo-electric plate is attached to a silicon single crystal substrate.

8. A piezo-electricity generation device according to claim 7, wherein said rectifying means is a diode formed on said silicon single crystal substrate.

9. A signal generator, including a piezo-electricity generation device having a rectifying means for rectifying an AC voltage generated by free-vibration of at least one piezo-electric plate and an accumulating means for accumulating therein an electric charge outputted through said rectifying means, comprising:

means, powered only by the piezo-electricity generation device, for setting a prespecified time period and releasing the electric charge accumulated in the accumulating means when the accumulated electric charge exceeds a preset voltage for the prespecified time period; and a signal output means, powered only by the piezo-electricity generation device, for receiving substantially all of the electric charge accumulated in said accumulating means after the accumulated electric charge exceeds the present voltage for the prespecified time period and applying only the received charge to generate a signal.

10. A piezo-electricity generation device according to claim 9, wherein said signal is in the form of an electric wave, a sound or a light.

11. A piezo-electricity generation device according to claim 9, wherein said rectifying means is a Schottky diode.

12. A piezo-electricity generation device according to claim 9, wherein said at least one piezo-electric plate is a combination of piezo-electric plates and three-dimensional vibration can be decomposed into respective components and each of said components vibrates a different one of said piezo-electric plates.

13. A piezo-electricity generation device according to claim 9, wherein said at least one piezo-electric plate includes multiple piezo-electric plates arranged with respect to each other so that voltages from the piezo-electric plates can be combined and a synthesized electric charge can thereby be accumulated in said accumulating means irrespective of a direction of vibration within a three-dimensional coordinate system.

14. A piezo-electric generation device according to claim 9, wherein a weight is added to a vibrating section of said at least one piezo-electric plate.

15. A piezo-electricity generation device according to claim 9, wherein said at least one piezo-electric plate is attached to a silicon single crystal substrate.

16. A piezo-electricity generation device according to claim 15, wherein said rectifying means is a diode formed on said silicon single crystal substrate.

17. A signal generator, including a piezo-electricity generation device having a rectifying means for rectifying an AC voltage generated by free-vibration of at least one piezo-electric plate and an accumulating means for accumulating therein electric charge outputted through said rectifying means, comprising:

a voltage setting means, powered only by the piezo-electricity generation device, for setting a prespecified voltage and generating a signal when the electric charge accumulated in the accumulating means exceeds the prespecified voltage;

a timing setting means, powered only by the piezo-electricity generation device, for setting a prespecified timing; and a signal output means for receiving substantially all of the electric charge stored in said accumulating means when an output voltage of said accumulating means exceeds the prespecified voltage set by said voltage setting means and at the prespecified timing set by said timing setting means and applying only the received charge to generate a signal.

18. A piezo-electricity generation device according to claim 17, wherein said signal is in the form of an electric wave, a sound or a light.

19. A piezo-electricity generation device according to claim 17, wherein said rectifying means is a Schottky diode.

20. A piezo-electricity generation device according to claim 17, wherein said at least one piezo-electric plate is a combination of piezo-electric plates and three-dimensional vibration can be decomposed into respective components and each of said components vibrates a different one of said piezo-electric plates.

21. A piezo-electricity generation device according to claim 17, wherein said at least one piezo-electric plate includes multiple piezo-electric plates arranged with respect to each other so that voltages from the piezo-electric plates can be combined and a synthesized electric charge can thereby be accumulated in said accumulating means irrespective of a direction of vibration within a three-dimensional coordinate system.

22. A piezo-electric generation device according to claim 17, wherein a weight is added to a vibrating section of said at least one piezo-electric plate.

23. A piezo-electricity generation device according to claim 17, wherein said at least one piezo-electric plate is attached to a silicon single crystal substrate.

24. A piezo-electricity generation device according to claim 23, wherein said rectifying means is a diode on said silicon single crystal substrate.

25. A signal generator, including a piezo-electric generation device having a rectifying means for rectifying voltage generated by free-vibration of at least one piezo-electric plate and an accumulation means for accumulating therein an electric charge outputted through said rectifying means, located on a small animal for transmitting a signal to determine the location and identity of the small animal, comprising:

a voltage setting means, powered only by the piezo-electricity generation device, for setting a prespecified voltage and generating a signal when the electric charge accumulated in the accumulating means exceeds the prespecified voltage; and a signal output means, powered only by the piezo-electricity generation device, for receiving substantially all of the electric charge accumulated in said accumulating means when an output voltage of said accumulating means exceeds the prespecified voltage set by said voltage setting means and applying only the received charge to generate the signal.

26. The signal generator according to claim 25, wherein the signal is transmitted as a coded identification number enabling a receiver of the signal to identify the location and identity of the small animal.

27. The signal generator according to claim 26, wherein the small animal is a migratory bird.

* * * * *